(12) United States Patent
Ceballos et al.

(10) Patent No.: US 9,276,604 B2
(45) Date of Patent: Mar. 1, 2016

(54) FEED FORWARD DOUBLE-SAMPLING MODULATOR

(71) Applicant: Infineon Technologies AG, Neubiberg (DE)

(72) Inventors: Jose Luis Ceballos, Villach (AT); Christian Reindl, Villach (AT); Snezana Stojanovic, Wernberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/305,184

(22) Filed: Jun. 16, 2014

(65) Prior Publication Data

US 2015/0365102 A1 Dec. 17, 2015

(51) Int. Cl.
*H03M 1/38* (2006.01)
*H03M 3/00* (2006.01)
*H03M 1/00* (2006.01)

(52) U.S. Cl.
CPC .............. *H03M 3/472* (2013.01); *H03M 1/001* (2013.01); *H03M 3/30* (2013.01)

(58) Field of Classification Search
CPC ..... H03M 3/472; H03M 1/001; H03M 3/304; H03M 3/30
USPC .......................................... 341/155, 161, 143
See application file for complete search history.

(56) References Cited

U.S. PATENT DOCUMENTS

| | | | | |
|---|---|---|---|---|
| 5,579,247 A | * | 11/1996 | Kerth et al. | 702/190 |
| 5,986,598 A | * | 11/1999 | Mittel | 341/143 |
| 7,796,069 B2 | * | 9/2010 | Li | 341/122 |
| 8,279,099 B2 | * | 10/2012 | Zare-Hoseini | 341/143 |
| 8,319,674 B2 | * | 11/2012 | Loeda et al. | 341/143 |

\* cited by examiner

*Primary Examiner* — Brian Young
(74) *Attorney, Agent, or Firm* — SpryIP, LLC

(57) ABSTRACT

Representative implementations of devices and techniques provide analog to digital conversion of an analog input. A multistage modulator using a feed-forward technique can alternately convert integrated samples of the analog input to digital representations. For example, the modulator is arranged to alternately output the digital representations to form a digital representation of the analog input.

25 Claims, 3 Drawing Sheets

FEED FORWARD DOUBLE-SAMPLING MODULATOR

BACKGROUND

Analog-to-digital converters (ADCs) convert time-discrete analog input values to a digital form. A type of ADC, the Σ-Δ modulator, digitizes the analog input values, and then analogizes the digital output signal by means of a digital-to-analog converter (DAC), generally feeding the analog value back to at least a subsequent analog input value. Σ-Δ modulators may be operated at a high frequency, making them usable in many communications applications. Accordingly, a distribution of the quantization noise, which results from quantization errors, can be achieved by means of a larger spectral range. The quantization noise can then be better eliminated from the digital output signal with the aid of suitable filters, for example.

One form of noise shaping, in the case of Σ-Δ modulators, includes shaping the quantization noise by feeding back a digital output signal (in analog form) to an earlier stage of the modulator, when the modulator is designed with multiple stages. In some examples, however, the use of multiple stages and/or a network of switched capacitors can result in a level of power consumption that is undesirable.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide analog to digital conversion of analog inputs. A multistage analog-to-digital converter (ADC) is described in the implementations. The multistage ADC employs a feed-forward modulator design including alternate signal paths. For example, control signals may be used to switch modulator signals among the alternate signal paths according to predetermined timing schemes. Such timing schemes may be applied to allow lower power consumption by the modulator while maintaining throughput.

In various implementations, sample and hold components or circuits may be used to acquire signal samples, and to make the samples available to different portions of the modulator. The sample and hold components may include one or more switched capacitors, for example. In some implementations, the sample and hold components include a double-sampling structure. For example, parallel capacitors may be used to sample a signal, and to make the sample available during offset timing intervals.

In an implementation, the multistage ADC is implemented in a differential or common mode design for improved signal-to-noise ratio (SNR). For example, in some cases, fully "floating" components may be referenced to a common-mode voltage rather than a ground potential. Additionally, the SNR of the modulator may be improved by using the alternate signal paths and switching schemes. For instance, the settling time of the operational amplifiers of the ADC can be increased, improving signal quality and stability, as inputs to integrator stages are switched between the differential signal paths.

Various implementations and techniques for an analog to digital conversion arrangement are discussed in this disclosure. Techniques and devices are discussed with reference to example analog-to-digital converter (ADC) devices and systems illustrated in the figures. In some cases, sigma-delta (Σ-Δ) modulator designs are shown and discussed. However, this is not intended to be limiting, and is for ease of discussion and illustrative convenience. The techniques and devices discussed may be applied to any of various ADC or modulator device designs, structures, and the like (e.g., direct-conversion ADC, flash ADC, ramp-compare ADC, integrating ADC (also referred to as dual-slope or multi-slope ADC), counter-ramp ADC, pipeline ADC, successive approximation ADC, time interleaved ADC, intermediate FM stage ADC, etc.), and remain within the scope of the disclosure. Further, the modulator designs described may be applied to other applications, including digital-to-analog converters (DAC), amplifiers, compression devices, and the like.

Implementations are explained in more detail below using a plurality of examples. Although various implementations and examples are discussed here and below, further implementations and examples may be possible by combining the features and elements of individual implementations and examples.

Example ADC Arrangement

Figure 1:
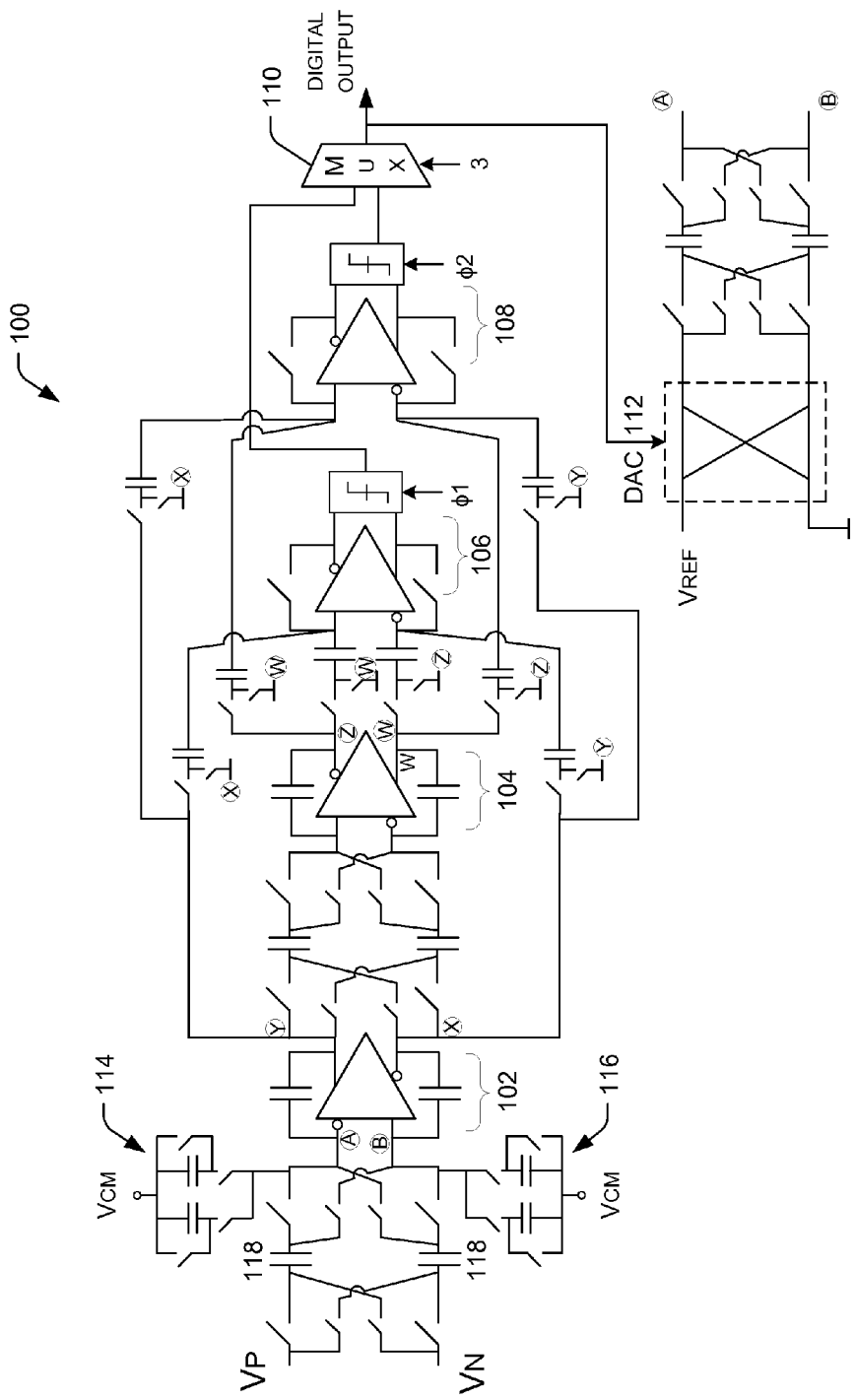
FIG. 1 is a schematic diagram of an example analog-to-digital converter (ADC) arrangement, wherein the techniques and devices disclosed herein may be applied, according to an implementation.

FIG. 1 is a block diagram of an example analog-to-digital conversion (ADC) arrangement 100, wherein the techniques and devices described herein may be applied. An analog signal ("analog input"), shown as differential signal portions Vp and Vn, is received on the input side, is converted by a quantity of modulator components, and a digital result ("digital output") is output from the ADC 100.

For the purposes of this disclosure, a digital result may be described as a digital approximation of an analog input. For example, a digital result may include a digital representation that is proportional to the magnitude of the voltage or current of the analog input, at a point in time and/or over a selected duration. The digital representation may be expressed in various ways (e.g., base 2 binary code, binary coded decimal, voltage values, electrical or light pulse attributes, and the like). In various implementations, digital output of the ADC 100 may have one bit or multiple bits, based on the configuration of the ADC 100.

The example ADC 100 is shown as having multiple stages (i.e., two or more stages), with a feed-forward design. In various implementations, any number of stages may be employed, with similar components and functionality to those shown in FIG. 1. As shown in FIG. 1, an example ADC 100 may include two or more cascaded integrator stages 102 and 104, and two or more comparator stages 106 and 108. In an implementation, the quantity of integrator stages is the same as the quantity of comparator stages. Additionally, the ADC 100 may include a multiplexer (MUX) 110 and a digital-to-analog converter (DAC) 112. In alternate implementations, an example ADC 100 may include fewer, additional, or alternate components.

In various implementations, the integrator stages (102, 104) integrate the analog input signal by taking samples of the analog signals at the differential inputs of the integrator stages (102, 104) at regular intervals, and determining a value for the difference between the sampled differential inputs.

In an implementation, as shown in FIG. 1, the first integrator stage 102 is arranged to receive the differential input signal portions Vp and Vn at inputs A and B. Sample and hold (SH) circuitry 114 and 116 are positioned at the differential signal paths coupled to inputs A and B. In the implementation, the SH 114 and 116 sample the inputs Vp and Vn, when switches coupled to the SH 114 and 116 are closed with respect to the inputs Vp and Vn.

In an implementation, as shown in FIG. 1, alternate signal paths are provided such that either of the input signals Vp or Vn may be coupled to the SH 114 or the SH 116, and vice versa, depending on which of the input switches coupled to the inputs are closed. Additional coupling capacitors 118 are also arranged in each differential input path, which may sample an input from one of the differential signal paths, and pass the sampled signal via the same path or via the opposite differential path to the SH 114 or the SH 116, as well as to the inputs A or B (based on the switch positions).

Figure 2:
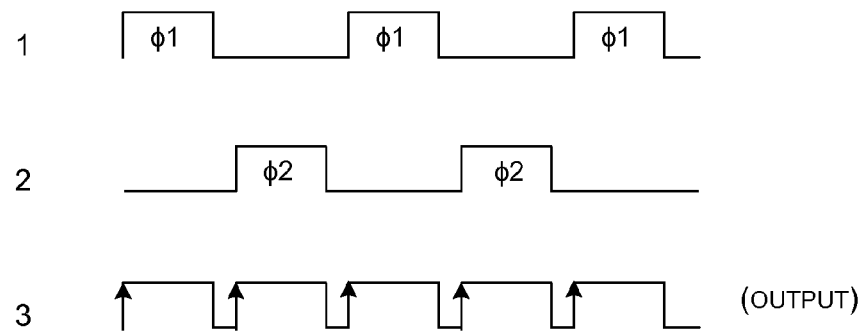
FIG. 2 is an example timing diagram for the switches of the ADC design of FIG. 1.

In an implementation, as shown in FIG. 1, the SH 114 and 116 are arranged to double-sample the inputs Vp and Vn. For example, parallel sampling capacitors are arranged in each of SH 114 and SH 116. In the implementation, double-sampling includes closing the switch to each of the parallel capacitors, one at a time, on each of alternating control signals. Referring to FIG. 2, one of the parallel capacitors may be coupled to an input on the phase 1 clock pulses, and the other of the parallel capacitors may be coupled to the input on the phase 2 clock pulses, for example.

In an implementation, double-sampling an input in this manner provides stable sampling values for integration with an opportunity to decrease power consumption. For example, referring to FIG. 2, the clock frequency of the control signals (1 and 2) may be reduced. Additionally, the settling time within the integrator stages (102, 104) is proportionately increased because of the clock frequency and double samples. Accordingly, power consumption may be decreased and SNR may be improved.

In an implementation, as shown in FIG. 1, the SH 114 and 116 dynamically set a common-mode input voltage, for the first and second integrator stages (102, 104), with regard to each of the differential input portions Vp and Vn and a common-mode voltage (Vcm). For example, as shown in FIG. 1, the SH 114 and the SH 116 are each coupled to the common-mode voltage Vcm at the opposite sides of the capacitances. Because of the common-mode reference in the SH 114 and 116, the integrator stages 102 and 104 are "floating," and are referenced to the common mode voltage Vcm, rather than a ground potential.

In an implementation, at least a portion of the error of the first integrator stage 102 may be converted to a common-mode signal by the second integrator stage 104, based on the differential structure and floating nature of the ADC 100. The common-mode error signal may be balanced between the differential signal paths, and thus, not affect the output of the comparators (106, 108).

In an implementation, the SH 114 and 116 hold the input samples; passing them to the integrator 102, at differential inputs A and B. Differential outputs Y and X of integrator stage 102 are passed, via alternate signal paths (determined by switch positions), to integrator stage 104.

In an example, as shown in FIG. 1, differential outputs Z and W of integrator stage 104 and/or differential outputs Y and X of integrator stage 102 may be fed forward to comparator stage 106, based on switch positions. In various implementations, the switch positions (and the set of differential signals input to comparator stage 106) may be determined by control signals 1 and 2, for example, as shown in FIG. 2. In an example, the sets of inputs (Y, X or Z, W) may alternately be input to the comparator stage 106 with the phase 1 and phase 2 pulses of the control signals 1 and 2.

As also shown in FIG. 1, the differential outputs Z and W of integrator stage 104 and/or the differential outputs Y and X of integrator stage 102 may be fed forward to comparator stage 108, based on switch positions. As described, in various implementations, the switch positions (and the set of differential signals input to comparator stage 108) may be determined by the phase 1 and phase 2 pulses of control signals 1 and 2, for example, as shown in FIG. 2.

In an implementation, as shown in FIG. 1, alternate signal paths are also provided from the integrator stages 102 and 104 to the comparator stages 106 and 108, such that the differential value pairs (Y, X) may be presented to the comparator stages 106 and 108 on alternate signal paths (based on switch positions) and such that the differential value pairs (Z, W) may be presented to the comparator stages 106 and 108 on alternate signal paths (based on switch positions).

For example, on a first clock cycle, the integrator stage 102 may feed an output (Y, X) forward to the comparator 106 and the integrator stage 104 may feed an output (Z, W) forward to the comparator 108. On the next clock cycle, the integrator stage 104 may feed an output (Z, W) forward to the comparator 106 and the integrator stage 102 may feed an output (Y, X) forward to the comparator 108, and so forth. In various implementations, predetermined switch combinations (as controlled by the control signals 1 and 2) may alternately determine which differential signal path each of the outputs (Y, X and Z, W) are carried on, determining whether the outputs arrive at the inverting input or the non-inverting input of the comparator stages 106 and 108, and determining the outputs of the comparator stages 106 and 108.

In an implementation, the digital outputs of each of the comparator stages 106 and 108 are fed to a multiplexer (MUX) 110, as shown in FIG. 1. In the implementation, the comparator stages 106 and 108 work alternately, according to the phase 1 and phase 2 pulses of the control signals 1 and 2, as shown in FIG. 2, each outputting a digital value to the MUX 110 in turn. In one example, the comparator stage (106, 108) that is not outputting a pulse to the MUX 110 (while the other comparator is outputting a pulse) may be receiving an input based on the switch positions.

In an example, the MUX 110 alternately selects the outputs of the comparator stages 106 and 108 as it operates according to the edges of the control signal 3 of FIG. 2, and based on the alternating digital values at the input of the MUX 110 from the comparator stages 106 and 108. In one example, the digital output of the MUX 110 comprises the digital output pulses of the ADC 100. For example, in one implementation, the output of the MUX 110 comprises a single bit-stream of pulses.

In an implementation, the DAC 112 also receives the digital output of the MUX 110, and converts it to an analog form. As shown in FIG. 1, the analog form of the digital output may be fed back, and combined with the analog differential signal at the inputs A and B of the first integrator stage 102. In an implementation, the analog form of the digital output, via the DAC, provides error correction for the ADC 100.

As discussed above, the techniques, components, and devices described herein with respect to the example ADC 100 are not limited to the illustration in FIG. 1, and may be applied to other ADC 100 devices and designs without departing from the scope of the disclosure. In some cases, additional or alternative components may be used to implement the techniques described herein. Further, the components may be arranged and/or combined in various combinations, while resulting in a digital output. It is to be understood that an ADC 100 may be implemented as a stand-alone device or as part of another system (e.g., integrated with other components, systems, etc.).

Representative Process

Figure 3:
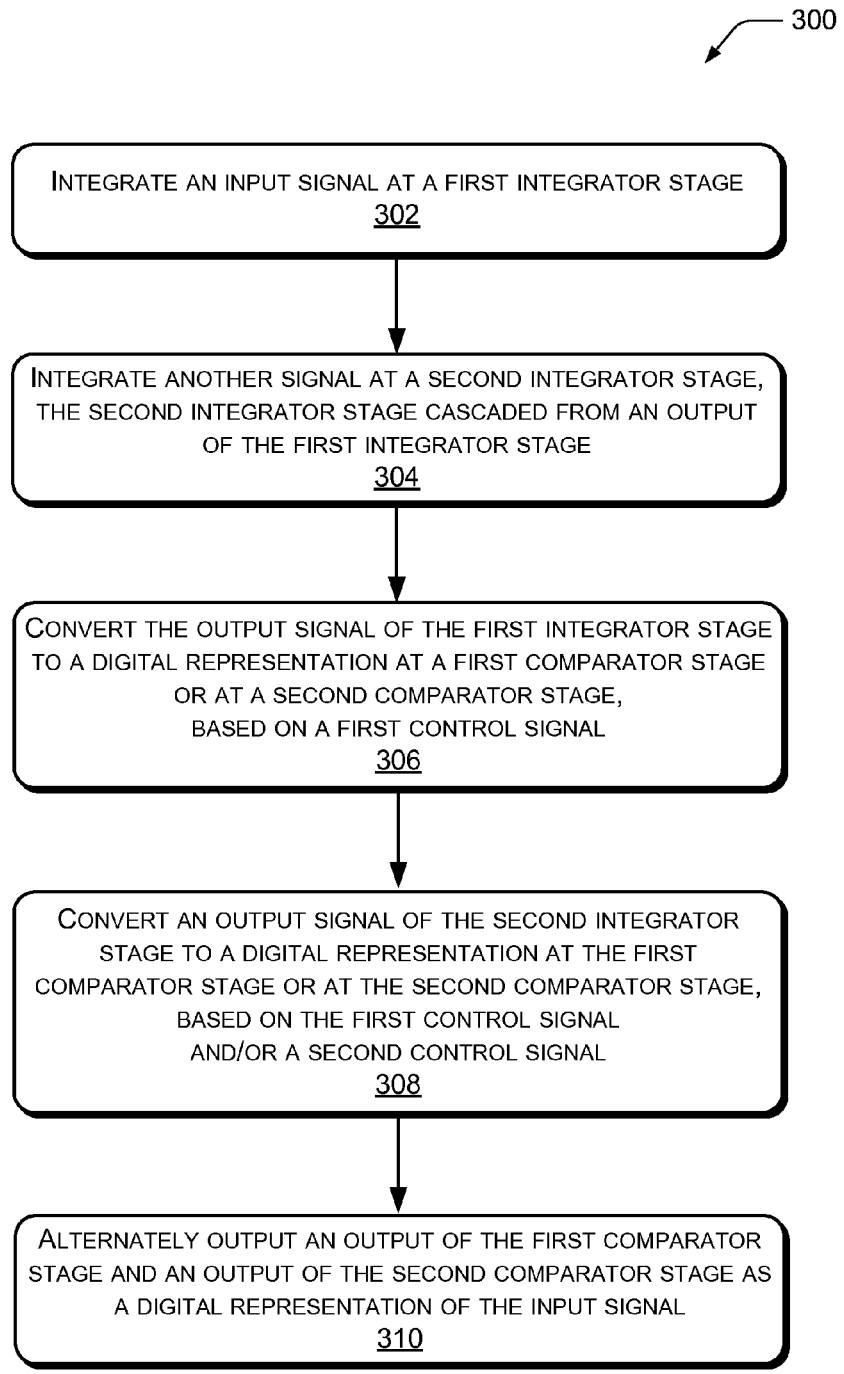
FIG. 3 is a flow diagram illustrating an example process for providing analog to digital conversion, according to an implementation.

FIG. 3 is a flow diagram illustrating an example process 300 for providing analog to digital conversion of time-discrete analog inputs, according to an implementation. The process 300 describes using a multistage modulator (such as ADC 100, for example) with a feed-forward technique. For example, the modulator is arranged to alternately output digital representations from alternating comparators to form a digital representation of an analog input signal. The process 300 is described with reference to FIGS. 1-5.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

In an implementation, the multistage modulator includes two or more integrator stages and an equal quantity of comparator stages. In other implementations, the quantity of comparator stages may vary.

At block 302, the process includes integrating an input signal at a first integrator stage (such as integrator stage 102, for example). In an implementation, the input signal is received at differential inputs of the first integrator stage. In an implementation, the process includes double-sampling the input signal via one or more switched capacitor networks and receiving the double-sampled input signal at the first integrator.

At block 304, the process includes integrating another signal at a second integrator stage (such as integrator stage 104, for example). In one example, the second integrator stage is cascaded from an output of the first integrator stage. For instance, the input of the second integrator stage may be coupled to the output of the first integrator stage via signal paths, capacitors, one or more switches, and the like.

In an implementation, the process includes coupling the one or more switched capacitor networks to a common-mode voltage and floating the first integrator stage and/or the second integrator stage via the common-mode voltage. In another implementation, the process includes reducing the clock frequency of the first integrator stage and/or the second integrator stage based on double-sampling the input signal. In the implementation, the settling time of the first and/or second integrator stages is increased, providing improved signal-to-noise ratio, based on the reduced clock frequency.

In an implementation, the process includes differentially coupling the second integrator stage to the first integrator stage and converting at least a portion of the output signal of the first integrator stage, such as the processing error of the first stage, for example, to a common-mode signal at the second integrator stage. As a common-mode signal, the error of the first stage may be inconsequential at subsequent differential stages of the modulator.

In another implementation, the process includes feeding the output signal of the first integrator stage forward to the first comparator stage or to the second comparator stage, based on a network of controllable switches. In an implementation, the switches may be controlled via control signals (such as control signals 1 and 2, for example). In one implementation, the process also includes feeding the output signal of the second integrator stage forward to the first comparator stage or to the second comparator stage, based on the network of controllable switches.

At block 306, the process includes converting the output signal of the first integrator stage to a digital representation at a first comparator stage or at a second comparator stage, based on a first control signal (such as control signal 1, for example).

At block 308, the process includes converting an output signal of the second integrator stage to a digital representation at the first comparator stage or at the second comparator stage, based on the first control signal and/or a second control signal (such as control signals 1 and 2, for example). In various implementations, the comparator stages used for the above conversions of blocks 306 and 308 may be selected via control signals (such as control signals 1 and 2, for example) acting on one or more switches in alternate signal paths.

In an implementation, the process includes alternating operation of the first and second comparator stages via the first and second control signals, the first and second comparator stages alternately outputting a digital pulse based on the first and second control signals. In the implementation, the comparator stages output the digital pulses to a multiplexer, or the like. The process thus includes multiplexing the digital pulse outputs of the first and second comparator stages, based on a third control signal. In an example, the third control signal comprises a combination of the first and second control signals, or the like.

At block 310, the process includes alternately outputting an output of the first comparator stage and an output of the second comparator stage (via the multiplexer, for example) as a digital representation of the input signal. In various implementations, the output comprises a stream of pulses. In one example, the stream is a single-bit stream of pulses, where every other pulse is an output of the alternating comparator stages.

In an implementation, the process includes converting the digital representation of the input signal (e.g., the pulse stream) to an analog form via a single digital-to-analog converter (DAC). In one example, the analog form is fed back to an input of the first integrator stage. In various implementations, feeding back the analog form provides error correction for the modulator.

In alternate implementations, other techniques may be included in the process 300 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An electronic device, comprising:
   a first integrator stage arranged to integrate an input signal, an output of the first integrator stage arranged to be coupled to an input of a first comparator stage or to an input of a second comparator stage, based on a control signal;
   a second integrator stage coupled in cascade to the first integrator stage, an output of the second integrator stage arranged to be coupled to the input of the first comparator stage or to the input of the second comparator stage, based on the control signal and/or another control signal; and
   a multiplexer arranged to receive an output of the first comparator stage and an output of the second comparator stage and to alternately output the output of the first comparator stage and the output of the second comparator stage.

2. The electronic device of claim 1, further comprising differential signal paths arranged to couple the first integrator stage to the first and second comparator stages and the second integrator stage to the first and second comparator stages, the first and second integrator stages and the first and second comparator stages arranged to process differential signals.

3. The electronic device of claim 1, further comprising alternate signal paths arranged to couple the first integrator stage to the first and second comparator stages and other alternate signal paths arranged to couple the second integrator stage to the first and second comparator stages, the alternate signal paths and the other alternate signal paths arranged to be selected based on the control signal and/or the other control signal.

4. The electronic device of claim 1, further comprising a first sample and hold (SH) component coupled to a first input of the first integrator and a second SH component coupled to a second input of the first integrator, the first and second SH components arranged to double-sample the input signal.

5. The electronic device of claim 4, wherein the first and second SH components are coupled to a common voltage, and the first and/or second integrator stages operate at a floating common-mode reference comprising the common voltage.

6. The electronic device of claim 1, further comprising a single digital-to-analog converter (DAC) arranged to convert a digital output of the multiplexer to an analog representation of the digital output and to feed the analog representation to an input of the first integrator stage.

7. The electronic device of claim 6, wherein the DAC is arranged to operate at a floating common-mode reference.

8. The electronic device of claim 1, wherein the first comparator stage and the second comparator stage alternately output a digital representation of an analog signal received from an integrator stage, based on the first control signal and the second control signal respectively.

9. The electronic device of claim 1, wherein the output of the multiplexer comprising the alternating output of the first comparator stage and the second comparator stage comprises a digital representation of the input signal.

10. A modulator, comprising:
    a first integrator stage arranged to integrate a differential input signal, an output of the first integrator stage arranged to be alternately processed by a first comparator stage and by a second comparator stage, based on a first control signal;
    a second integrator stage differentially coupled in cascade to the first integrator stage, an output of the second integrator stage arranged to be processed alternately by the first comparator stage and by the second comparator stage, based on a second control signal; and
    a multiplexer arranged to alternately receive an output of the first comparator stage and an output of the second comparator stage based on the first and second control signals and to output the output of the first comparator stage and the output of the second comparator stage based on a third control signal.

11. The modulator of claim 10, further comprising one or more switched capacitor networks arranged to double-sample an input signal to the first integrator stage and/or to double-sample an input to the second integrator stage.

12. The modulator of claim 10, further comprising a single digital-to-analog converter (DAC) arranged to convert a digital output of the multiplexer to an analog representation of the digital output and to feed back the analog representation to an input of the first integrator stage.

13. The modulator of claim 12, wherein the DAC is referenced to a common-mode voltage, and is without a connection to a ground.

14. The modulator of claim 10, wherein the first and second integrator stages are referenced to a common-mode voltage, and are operated without a connection to a ground.

15. The modulator of claim 10, wherein the output of the first integrator stage is arranged to be differentially coupled to an input of the second integrator stage, the second integrator stage arranged to convert at least a portion of a processing error of the first integrator stage to a common-mode signal.

16. A method, comprising:
    integrating an input signal at a first integrator stage;
    integrating another signal at a second integrator stage, the second integrator stage cascaded from an output of the first integrator stage;
    converting the output signal of the first integrator stage to a digital representation at a first comparator stage or at a second comparator stage, based on a first control signal;
    converting an output signal of the second integrator stage to a digital representation at the first comparator stage or at the second comparator stage, based on the first control signal and/or a second control signal; and
    alternately outputting an output of the first comparator stage and an output of the second comparator stage as a digital representation of the input signal.

17. The method of claim 16, further comprising double-sampling the input signal via one or more switched capacitor networks and receiving the double-sampled input signal at the first integrator.

18. The method of claim 17, further comprising coupling the one or more switched capacitor networks to a common-mode voltage and floating the first integrator stage and/or the second integrator stage via the common-mode voltage.

19. The method of claim 17, further comprising reducing a clock frequency of the first integrator stage and/or the second integrator stage based on double-sampling the input signal.

20. The method of claim 16, further comprising differentially coupling the second integrator stage to the first integrator stage and converting at least a portion of the output signal of the first integrator stage to a common-mode signal at the second integrator stage.

21. The method of claim 16, further comprising feeding the output signal of the first integrator stage forward to the first comparator stage or to the second comparator stage, based on a network of controllable switches and feeding the output signal of the second integrator stage forward to the first comparator stage or to the second comparator stage, based on the network of controllable switches.

22. The method of claim 16, further comprising alternating operation of the first and second comparator stages via the first and second control signals, the first and second comparator stages alternately outputting a digital pulse based on the first and second control signals.

23. The method of claim 22, further comprising multiplexing digital pulse outputs of the first and second comparator stages based on a third control signal, the third control signal comprising a combination of the first and second control signals.

24. The method of claim 16, further comprising converting the digital representation of the input signal to an analog form via a single digital-to-analog converter (DAC), and feeding the analog form back to an input of the first integrator stage.

25. A sigma-delta modulator, comprising:
- a first differential common-mode integrator stage arranged to integrate a differential input signal, a differential output of the first integrator stage arranged to be converted to a first digital representation by a first comparator stage or by a second comparator stage, based on a first control signal;
- a second differential common-mode integrator stage differentially coupled in cascade to the first integrator stage and arranged to integrate a second differential signal, a differential output of the second integrator stage arranged to be converted to a second digital representation by the first comparator stage or by the second comparator stage, based on a second control signal;
- one or more switched capacitor networks arranged to double-sample the differential input signal and the second differential signal, the one or more switched capacitor networks coupled to a common-mode voltage reference;
- a multiplexer arranged to alternately receive an output of the first comparator stage and an output of the second comparator stage based on the first and second control signals and to alternately output the first digital representation and the second digital representation, to form a digital representation of the input signal, based on a third control signal; and
- a single digital-to-analog converter (DAC) arranged to convert the digital representation of the input signal to form an analog representation and to feed back the analog representation to an input of the first differential common-mode integrator stage.

* * * * *